United States Patent

Bangham et al.

[11] Patent Number: 5,912,826
[45] Date of Patent: Jun. 15, 1999

[54] DATA PROCESSING METHOD AND APPARATUS

[75] Inventors: James Andrew Bangham, Norwich; Robert William Young, Ely; Nigel Lawrence Bragg, Weston Colville, all of United Kingdom

[73] Assignee: Cambridge Consultants Limited, Cambridge, United Kingdom

[21] Appl. No.: 08/875,055

[22] PCT Filed: Dec. 31, 1995

[86] PCT No.: PCT/GB95/03012

§ 371 Date: Jun. 24, 1997

§ 102(e) Date: Jun. 24, 1997

[87] PCT Pub. No.: WO96/20531

PCT Pub. Date: Jul. 4, 1996

[30] Foreign Application Priority Data

Dec. 24, 1994 [GB] United Kingdom .................. 9426273

[51] Int. Cl.[6] ........................................ G06F 17/10
[52] U.S. Cl. ........................ 364/724.011; 364/724.014; 364/724.17

[58] Field of Search ................... 364/715.06, 715.013, 364/724.011, 724.012, 724.013, 724.014, 724.03, 724.16, 724.17

[56] References Cited

U.S. PATENT DOCUMENTS

| 4,928,258 | 5/1990 | May | 364/724.17 |
|---|---|---|---|
| 5,097,433 | 3/1992 | Caraccilo | 364/724.014 |
| 5,319,583 | 6/1994 | Wildes | 364/724.013 |

FOREIGN PATENT DOCUMENTS

WO 94/16499  7/1994  WIPO .

*Primary Examiner*—Chuong Dinh Ngo
*Attorney, Agent, or Firm*—Lee, Mann, Smith, McWilliams, Sweeney & Ohlson

[57] ABSTRACT

A method of filtering a signal conglomerate using a data-sieve having a plurality of filtering stages in cascade, at least one of the filtering stages comprising a recursive ordinal value filter. A typical arrangement comprises a sequence of recursive median filters of increasing scale (window size), providing low pass outputs from differing stages to enable a bandpass output to be formed by taking the difference between the low pass outputs.

34 Claims, 13 Drawing Sheets

Notes:

Scales are increasing so s1 < s2 < s3.
Filtering stages using max and min operators may use any number of max and min operators of the same window size.
Recursive median filtering stages and stages based on max and min operators may be arranged in any order Input signal          0 1 0 1 0 1 0 3 3 3 0 0 2 2 0 0 0

Root median datasieve

| Scale 1 | Pass 1 | 0 0 1 0 1 0 1 3 3 3 0 0 2 2 0 0 0 |
|---|---|---|
|  | Pass 2 | 0 0 0 1 0 1 1 3 3 3 0 0 2 2 0 0 0 |
|  | Pass 3 | 0 0 0 0 1 1 1 3 3 3 0 0 2 2 0 0 0 |
| Scale 2 | Pass 1 | 0 0 0 0 1 1 1 3 3 3 2 2 0 0 0 0 0 |
| Scale 3 | Pass 1 | 0 0 0 0 1 1 1 2 2 2 2 2 0 0 0 0 0 |
| Scale 4 | Pass 1 | 0 0 0 0 1 1 1 2 2 2 2 2 0 0 0 0 0 |
| Scale 5 | Pass 1 | 0 0 0 0 1 1 1 1 1 1 1 1 0 0 0 0 0 |

Recursive median datasieve

| Scale 1 | Pass 1 | 0 0 0 0 0 0 0 3 3 3 0 0 2 2 0 0 0 |
|---|---|---|
| Scale 2 | Pass 1 | 0 0 0 0 0 0 0 3 3 3 2 2 2 2 0 0 0 |
| Scale 3 | Pass 1 | 0 0 0 0 0 0 0 2 2 2 2 2 2 2 0 0 0 |
| Scale 4 | Pass 1 | 0 0 0 0 0 0 0 2 2 2 2 2 2 2 0 0 0 |
| Scale 5 | Pass 1 | 0 0 0 0 0 0 0 2 2 2 2 2 2 2 0 0 0 |

Fig. 2

Example input data

Data: 0 1 0 1 0 1 0 3 3 3 0 0 2 2 0 0 0

Contents of extrema and run lists after processing at scale Sn

| | Extrema list | | | | | Run length list | | | | |
|---|---|---|---|---|---|---|---|---|---|---|
| Scale: | Start | S1 | S2 | S3 | S4 | Start | S1 | S2 | S3 | S4 |
| List contents | 2,1 | 8,3 | 8,3 | 8,7 | 8,7 | 1,0,1 | 1,0,7 | 1,0,7 | 1,0,7 | 1,0,7 |
| | 3,1 | 11,2 | | | | 2,1,1 | 8,3,3 | 8,3,3 | 8,2,7 | 8,2,7 |
| | 4,1 | 13,2 | | | | 3,0,1 | 11,0,2 | 11,2,4 | 15,0,3 | 15,0,3 |
| | 5,,1 | | | | | 4,1,1 | 13,2,2 | 15,0,3 | | |
| | 6,1 | | | | | 5,0,1 | 15,0,3 | | | |
| | 7,1 | | | | | 6,1,1 | | | | |
| | 8,3 | | | | | 7,0,1 | | | | |
| | 11,2 | | | | | 8,3,3 | | | | |
| | 13,2 | | | | | 11,0,2 | | | | |
| | | | | | | 13,2,2 | | | | |
| | | | | | | 15,0,3 | | | | |

Notation: (start index, extent)

Notation: (start index, amplitude, length)

Example of the operation of the fast method for computing the recursive median datasieve.

Fig. 10

DATA PROCESSING METHOD AND APPARATUS

FIELD OF INVENTION

This invention concerns methods and apparatus for processing data, particularly but not exclusively electrical signals, by filtering the data according to value and extent (duration). The invention is of particular application in the field of image analysis, pattern recognition and the like.

BACKGROUND OF THE INVENTION

A technique of data processing as aforesaid has been described inter alia in PCT/GB94/00080, in which a series of data values are subjected to a so-called Datasieve, in which the values are successively filtered using a progressively increasing size criterion and the output of each successive filtering stage supplies the input to the next.

The Datasieve as described in PCT/GB94/00080 employs ordinal value filtering in each stage, and a commonly used ordinal value filter is a median filter.

This type of processing often requires a root signal to be obtained from each filtering stage (ie a signal that is invariant to further processing if recycled through the filter which has produced it). Using conventional ordinal value filters and particularly median filters, has involved the recycling of the filtered values two or three times or more through the same stage before a root signal has been obtained, and where this has to occur a number of times at each stage, the computational complexity and buffer storage requirements have detracted from the advantages obtained from Datasieve.

It is an object of the present invention to provide a filtering technique and apparatus for use in the successive filtering stages of the Datasieve which does not suffer from this particular disadvantage.

It is another object of the present invention to provide a method of operating the Datasieve at a higher speed.

DEFINITIONS

An ordinal value operator, (also known as a rank order operator), of ordinal value p is a non-linear operator that takes as its input w data samples (w>=p) and outputs the p'th largest value (1<=p<=w) from the w input samples.

The normalised rank of the operator, r, is defined by r=(p−1)/(w−1) so o<=r<=1.

An ordinal value filter processes a signal by applying the ordinal value operator at each possible position along the input signal to form a filtered output signal. This corresponds to sliding a window containing w samples along the signal and applying the ordinal value operator to the contents of each window, to produce an output sample for each window position.

A Datasieve is a device for performing a method of filtering and analysing signals which applies ordinal value filters in a cascade such that the output of the n'th filter forms the input to the (n+1)'th filter in the succession, and in which the 'scale' increases at each successive filtering stage.

The 'scale' of a filter corresponds to the extent (ie width or duration) of the signal features that it removes, and this is related to the number of input samples to each ordinal value operator, ie. the extent of the window. For an ordinal value filter of a particular normalised rank, larger windows correspond to greater filtering scales. However, for different types of ordinal value filter, the window size corresponding to a particular filtering scale may be different.

SUMMARY OF THE INVENTION

According to one aspect of the present invention, in a Datasieve (as aforesaid) at least one of the succession of filtering stages is constructed and operates as a recursive ordinal value filter, typically a recursive median filter.

The key difference between a non-recursive ordinal value filter and a recursive ordinal value filter, is that a non-recursive ordinal value filter operates on a group of data values all of which are taken from the input signal, whereas a recursive ordinal value filter operates on a group of values made up of future input values and past output values of the filter.

For illustrative purposes, consider a particular ordinal value filter—the median filter, which has normalised rank ½. For an input signal x(m) a median filter of scale n (also-known as the 'order' of the median filter) forms an output value y(k) from 2*n+1 input samples as follows:

$$y\_median(k) = \\ median\{x(k-n), x(k-n+1), \ldots, x(k-1), x(k), x(k+1), \ldots, x(k+n)\}$$

whereas a recursive median filter calculates the corresponding output value as follows:

$$y\_rec\_median(k) = \\ median\{y(k-n), y(k-n+1), \ldots, y(k-1), x(k), x(k+1), \ldots, x(k+n)\}$$

where data samples of the form y(p) are previous output samples from the filter corresponding to earlier window positions. It is assumed that the window is being moved in a direction corresponding to increasing k.

This definition of a recursive median filter assumes that the window scans progressively across the data from small index values to large index values. However, in general, the possible window positions for the median operator can be processed in an arbitrary order, in which case the median operator is applied to various combinations of input samples x(p) and output samples y(p) depending on whether that sample has been previously processed at an earlier window position. One common alternative scanning order is to process the signal in the reverse direction. This generalisation also applies to other recursive ordinal value filters.

It has already been noted that data sometimes has to be passed through a non-recursive median filter several times before a <u>root</u> median value is obtained, whereas if a recursive median filter is employed, a root median value is obtained after only a single pass.

As a result, an important advantage of using recursive ordinal value filters in a Datasieve is that the computational complexity is reduced compared with using non-recursive ordinal value filters that must be re-applied a number of times at each filtering stage in order to produce a root signal from that stage.

An additional advantage is that recursive ordinal value filtering can be performed "in-place" at each stage in the Datasieve. This means that it is not necessary to use separate input and output data buffers for each filtering stage. Instead, the output sample from the filter at each window position can be written back to the input buffer before processing at the next window position. This reduces the memory requirements of the arrangement.

Datasieve apparatus and methods may be employed to reduce noise (usually short duration, randomly occurring, random value signals), and according to another aspect of the invention there is provided a method of filtering a signal conglomerate using a Datasieve to separate wanted signals from unwanted signals, comprising the steps of:

1. for the first filtering stage, filtering at least a selected part of the signal conglomerate using an ordinal value filter of scale S1, (where increasing filtering scales correspond to increasing window sizes for ordinal value filters of a particular normalised rank, and where the filtering scale is related to the extent (width or duration) of the signal features removed), 2. for the second filtering stage, filtering the output from the previous filtering stage with an ordinal value filter of scale S2, (where S2 is greater than S1), and thereafter filtering the successive filter outputs with filters of increasing scale up to SN, and 3. utilizing the output of at least one of the ordinal value filters in the succession as at least part of the final output signal, wherein at least one filtering stage between the stages employing scales S1 and SN comprises a recursive ordinal value filter.

For the or each non-recursive ordinal value filter, the filter window at each position along the input signal contains only input samples to the filtering stage, while for the or each recursive ordinal value filter, the filter window at each position contains input samples to the filtering stage for those samples that have not already been processed by the filter at previous window positions, but previous output samples from the filter for those samples that have already been processed by the filter at previous window positions.

A recursive median filter may be used for at least one of the filtering steps.

Typically the window of the recursive median filter used for the said at least one of the filtering steps, is of size $2*n+1$ samples and, at each position along the data, contains the $\underline{n}$ previous output samples from the filter, the current sample to be filtered, and the next $\underline{n}$ input samples to the filter.

More than one ordinal value filter may be incorporated into at least one of the filtering stages, and the final output from such a filtering stage may be formed from the output of one, or more of the filters, and where it is formed from more than one, the outputs of the two or more filters are combined to form the said final output.

Where more than one ordinal value filter is used for at least one filtering stage, and at least two of the filters are arranged in a cascade such that the output of the n'th ordinal value filter in the cascade forms the input to the (n+1)'th ordinal value filter, a final output from the filtering stage is derived from the output of one of the filters in the cascade, or from two or more such filters by combining the outputs therefrom.

The method envisages the use of a minimum ordinal value filter (which takes the minimum input value as its output), or a maximum ordinal value filter (which takes the maximum input value as its output), or a cascade of maximum and minimum ordinal value filters, for at least one of the filtering steps.

Low pass filtering of a signal to remove signal components corresponding to signal excursions of limited extent may be achieved by forming an output signal from the Datasieve corresponding to the output of a selected filtering step in the succession.

It has been found that when performing noise reduction using a low pass Datasieve based on recursive median filters, the performance is almost as good as a Datasieve based on none recursive root median filters (which have much higher computational load). Furthermore, the performance is better than using a Datasieve based on non-recursive simple (ie non-root) median filters (which has a similar computational load).

Band pass filtering of a signal to extract signal components corresponding to excursions of the signal with a particular range of extents may be achieved by subtracting the output of one filtering stage from the output of another filtering stage in the succession of stages.

Where the conglomerate is multidimensional, the windows used by the ordinal value filters in the succession may be multidimensional.

A method of signal analysis, using a Datasieve to separate different components of a signal conglomerate, typically comprises the steps of:

1. for the first filtering stage, filtering at least a selected part of the signal conglomerate using an ordinal value filter of scale S1, (where increasing filtering scales correspond to increasing window sizes for ordinal value filters of a particular normalised rank, and where the filtering scale is related to the extent (width or duration) of the signal features removed), 2. for the second filtering stage, filtering the output from the previous filtering stage with an ordinal value filter of scale S2, (where S2 is greater than S1), and thereafter filtering the successive filter outputs with filters of increasing scale up to SN, and 3. forming the difference between the input signal and the output signal from one or more of the filtering stages in the succession to form one or more bandpass outputs wherein at least one of the filtering stages comprises a recursive ordinal value filter.

Pulses appearing in each such bandpass output comprise a contiguous sequence of equal valued data samples.

For the or each non-recursive ordinal value filter, the filter window at each position along the input signal contains only input samples to the filtering stage, while for the or each recursive ordinal value filter, the filter window at each position contains input samples to the filtering stage for those samples that have not already been processed by the filter at previous window positions, but output samples from the filter for those samples that have already been processed by the filter at previous window positions.

An output signal may be formed by selecting from the pulses contained within the bandpass output signals a subset of the pulses according to a selection criterion, and outputting information describing the selected pulses.

Alternatively an output signal may be formed by selecting from the pulses contained within the bandpass output signals a subset of the pulses according to a selection criterion, and then combining the pulses of the subset to produce an output signal whose amplitude is the sum of the amplitudes of the pulses in the subset.

A recursive median filter may be used for at least one of the filtering steps.

Typically the window of the recursive median filter used for the said at least one of the filtering steps, is of size $2*n+1$ samples and, at each position along the data, contains the $\underline{n}$ previous output samples from the filter, the current sample to be filtered, and the next $\underline{n}$ input samples to the filter.

More than one ordinal value filter may be incorporated into at least one of the filtering stages, and the final output from such a filtering stage may be formed from the output of one, or more of the filters, and where it is formed from more than one, the outputs of the two or more filters are combined to form the said final output.

Where more than one ordinal value filter is used for at least one filtering stage, and at least two of the filters are arranged in a cascade such that the output of the n'th ordinal value filter in the cascade forms the input to the (n+1)'th ordinal value filter, a final output from the filtering stage is derived from the output of one of the filters in the cascade, or from two or more such filters by combining the outputs therefrom.

The method envisages the use of a minimum ordinal value filter (which takes the minimum input value as its output), or a maximum ordinal value filter (which takes the maximum input value as its output), or a cascade of maximum and minimum ordinal value filters, for at least one of the filtering steps.

Where the conglomerate is multidimensional, the windows used by the ordinal value filters in the succession may be multidimensional.

The invention also lies in an improved, high speed method for recursive median filtering using a Datasieve, and to methods in which recursive median filters are used for some filtering stages while combinations of maximum and minimum ordinal filters are used at other stages in a Datasieve.

The use of a recursive median filter simplifies the construction and operation of a Datasieve because it is not necessary to use separate buffers to hold the input signal to a filtering stage, and the output signal from the same filtering stage. Thus the processing can be performed 'in place'. This is a direct result of the use of a recursive filter, as the input samples for the filter for each "position" of its input window are taken from previous output samples from earlier window positions and later input samples that have not yet been processed. In addition, it is guaranteed that only a single pass of the filter is required at each processing stage to derive a root signal, unlike a simple median filter. These factors provide the following benefits:

Memory requirements are reduced.

Circuit complexity and where the circuit is to be realised as a semiconductor, the required substrate area (eg. silicon area) are reduced.

Speed is increased as compared with a non-recursive root median Datasieve.

Since at a given filtering stage the recursive median filter only modifies the signal at extrema in the signal of extent corresponding to the scale of the current filter, the speed of operation can be increased by generating a list or lists of the positions of extrema in the signal, then processing the signal at the locations corresponding to extrema of the appropriate extent, at each processing stage.

For stages where a recursive median filtering function is required, extrema representing both maxima and minima are processed.

For stages where a maximum followed by a minimum non-recursive ordinal filtering function is required, only extrema representing minima are processed.

For stages where a minimum followed by a maximum non-recursive ordinal filtering function is required, only extrema representing maxima are processed.

Processing involving these combinations of maximum and minimum filters can also be performed "in-place", so these filters are easy to integrate with processing based on a recursive median filter.

It is convenient, but not essential, to arrange the list of extrema positions in order of increasing extrema extent. Alternatively, different lists may be used to store extrema of different extents. It may also be advantageous to store the positions of maxima and minima in different lists.

In addition, it is convenient, but not essential, to run-length encode the input signal. Then, whenever an extremum is processed, the new value of the run corresponding to the extremum is either the value of the run immediately before the extremum or the run immediately after the extremum, depending on which is closest in value to the extremum value. Thus, processing an extremum results in at least two adjacent runs being merged into a single run (three runs may be merged if the two runs adjacent to the extremum have equal value).

If the run with which the extremum becomes merged also represents an extremum of the opposite polarity, then the processing will result in the two extrema being reduced to a monotone, and the two extrema can be deleted from the list of extrema.

If three runs are merged into a single run, and all three correspond to extrema, then the result is a single extrema of polarity equal to the central extremum. This permits the two outer extrema to be removed. However this refinement is optional as just using two run merging, in which the choice of whether the central run is merged with the run before or the run after is arbitrary, will also give the same result after an additional processing step at a higher scale at which two runs of the same value are merged.

A high speed method for Datasieve processing that uses one or more recursive median filters for at least one of the filtering stages, includes the step of identifying extrema (maxima and minima) in the input signal to at least one of the filtering stages, and at each stage filtering only extrema having an extent related (typically equal) to the scale of the ordinal value filter comprising the each said stage, where the extent of an extremum is the number of equal amplitude data samples that form the peak of the extremum.

An alternative to the high speed method aforesaid, involves the step of identifying extrema (maxima and minima) in the input signal to at least one of the filtering stages, and at each stage filtering only extrema having extent less than or equal to the scale of the ordinal value filter comprising the each said stage, where the extent of an extremum is the number of equal amplitude data samples that form the peak of the extremum.

In either of the preceding methods, both maxima and minima in the input signal to at least one filtering stage can be filtered, by using a recursive median filter at that stage; or only maxima in the input signal are filtered, by using a minimum ordinal value filter followed by a maximum ordinal value filter at that stage; or only minima in the input signal are filtered by using a maximum ordinal value filter followed by a minimum ordinal value filter at that stage.

In an alternative method, the input signal to at least one of the Datasieve filtering stages is searched for extrema, and information which describes the location of each detected extremum within the input signal, is stored in a memory.

As a development of the said alternative method, information about extrema widths is also stored in a memory.

Information about maxima may be stored in a separate memory or list to information about minima. This is beneficial if one or more of the following stages used in the Datasieve require processing of both maxima and minima, while one or more of the other stages only require processing of either maxima or minima.

According to a preferred feature of the invention the information stored in memory describing the extrema in the input signal to a filtering stage is modified directly when an extremum is processed, so that it is not necessary to use a separate output buffer to hold information describing the extrema in the output signal from a filtering stage.

According to another preferred feature of the invention, the new amplitude of the data samples corresponding to an extremum that requires filtering is determined by referring to three data values: (i) the amplitude of the extremum itself, (ii) the amplitude of the data sample immediately before the extremum and (iii) the amplitude of the data sample immediately after the extremum, wherein the amplitude of the samples adjacent to the extremum are equal to their filtered values if they have already undergone filtering in the current filtering stage, or to the corresponding input values to that stage if they have not already undergone filtering in that stage.

Where the filtered value of an extremum is equal to the value of an adjacent sample that forms at least part of another extremum of opposite polarity, then the method preferably includes the step of excluding either one or both of the two extrema from the list of extrema that is passed to the next filtering stage.

In a preferred form of the invention, the list of extrema stored in memory is ordered according to the location of the extrema in the data signal. Alternatively, the list of extrema may be ordered according to the extents of the extrema. By ordering the extrema, the processing speed can be increased.

Preferably the data is stored in an encoded form, in which at least part of the stored information describes contiguous sequences of equal valued data samples (ie "runs).

The stored information for each contiguous sequence of equal value data samples may include the number of data samples in the sequence and the amplitude of the data samples.

Preferably the stored information for each contiguous sequence of equal value data samples includes data identifying the locations within the signal of at least two of the data samples in the sequence, and the amplitude of the data samples.

Typically it is not necessary to use a separate output buffer to hold a representation of the output signal from a filtering stage. Instead a memory containing a representation of the input signal to the filtering stage can be modified directly during processing.

Processing an extremum in the signal typically only requires reference to the amplitudes of three runs in the data: the run corresponding to the extremum, the run immediately before the extremum and the run immediately after the extremum.

The invention allows processing to be undertaken at multiple orientations using one-dimensional Datasieve techniques. Thus a method of filtering a multidimensional conglomerate of data using a Datasieve comprises the steps of forming one-dimensional signals by scanning the multidimensional input signal at a plurality of different orientations, and filtering the one-dimensional signals using a one-dimensional Datasieve circuit wherein at least one of the filtering steps comprises a recursive ordinal value filter.

A multidimensional output signal can be constructed by combining the output signals from each of the one-dimensional Datasieves.

The invention also lies in a method of filtering a multi-dimensional signal conglomerate by scanning the signal conglomerate at one orientation to produce one-dimensional signals and applying the one-dimensional signals so obtained to a Datasieve, thereby to produce intermediate signals, scanning the intermediate signals at a different orientation to produce a further set of signals and applying said further set of signals to a Datasieve to produce a final multidimensional output signal, wherein at least one of the Datasieves uses a recursive ordinal value filter for at least one filtering stage.

Alternatively, where a multidimensional signal conglomerate is scanned and Datasieve filtered at two or more orientations in which at least one of the Datasieves operates using a recursive ordinal value filter for at least one filtering stage, then an output signal can be generated by combining output signals derived from at least two or more of the Datasieves filtering the signals at the different orientations.

The invention also lies in a method of filtering a multi-dimensional signal conglomerate which is first filtered using conventional filtering techniques, and the output signal is filtered at a plurality of orientations using for at least one of the orientations a one-dimensional Datasieve that uses a recursive ordinal value filter for at least one filtering stage.

Alternatively, a method of filtering a multidimensional signal conglomerate as aforesaid may be performed in reverse order, in which the signal is first filtered at a plurality of different orientations in which a least one of the orientations is subjected to a Datasieve that uses a recursive ordinal value filter for at least one following stage, and an output signal therefrom obtained by combining the outputs from different orientations, is then filtered using conventional filtering techniques.

The invention also lies in apparatus for performing any of the aforesaid methods and in a computer when programmed to perform any of the aforesaid methods.

The invention will now be described by way of example, with reference to the accompanying drawings in which:

FIGS. 1A and 1B compares the effects of filtering a signal using a non-recursive median Datasieve and a recursive median Datasieve;

FIG. 2 shows the operation of the non-recursive median Datasieve and recursive median Datasieve in more detail;

FIG. 10 is a detailed example showing the operation of the fast Datasieve processing method;

The methods and apparatus described herein relate to a Datasieve that uses a particular class of ordinal value filter, known as a recursive ordinal value filter. For illustrative purposes, we shall consider the example of a Datasieve based on a recursive median filter and compare its operation with a Datasieve based on ordinary median filters.

A median filter is an ordinal value filter of window size $w=2*p-1$ samples, that takes as its output the p'th largest value from the window (ie. the 'middle' value if the samples are ordered in terms of increasing value). Thus a median filter has rank 0.5.

Figure 1A:
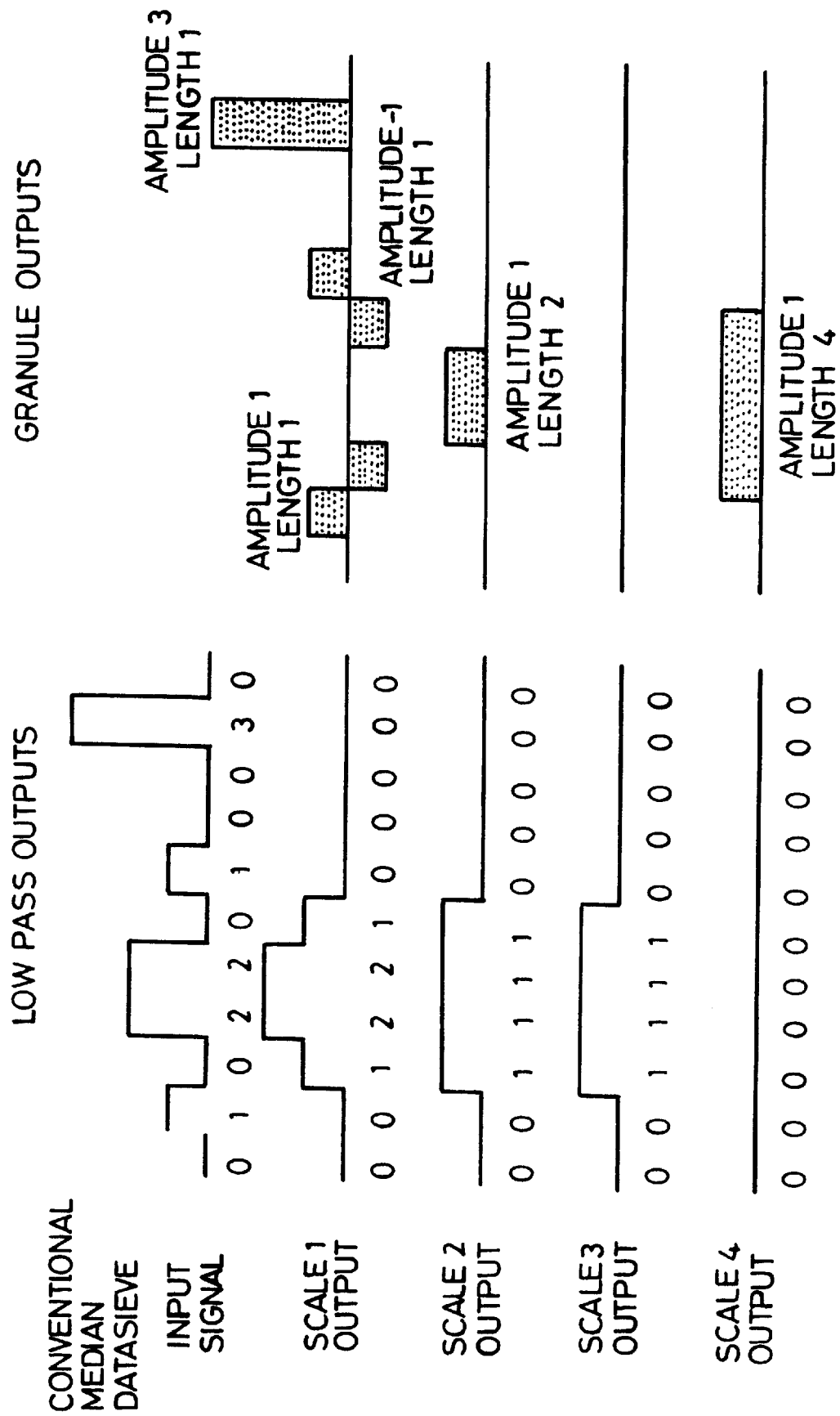
Figure 1B:
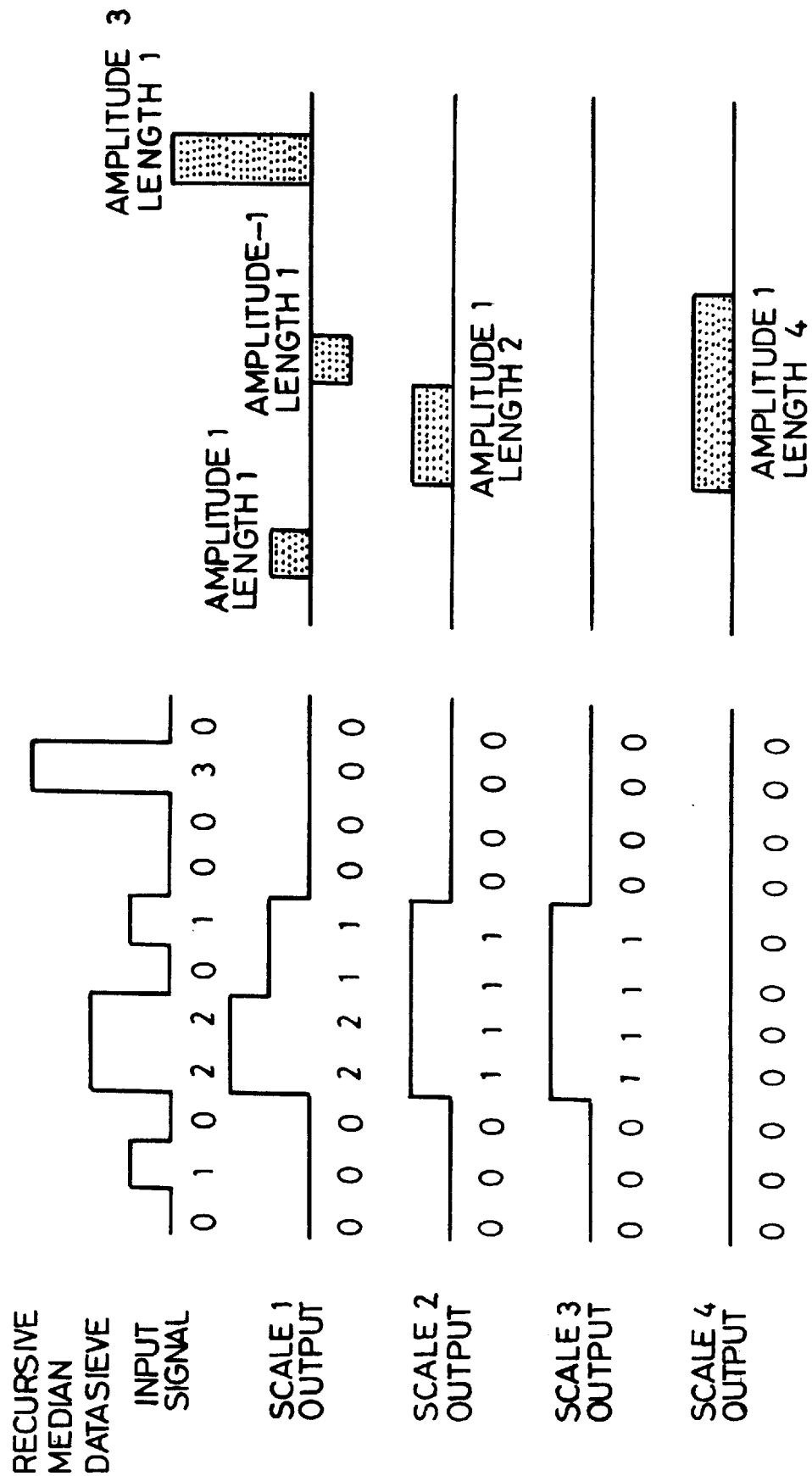

A comparison of the operation of a recursive median Datasieve and a simple (non-recursive) median Datasieve can be seen from FIGS. 1 and 2. Several passes of the simple median filter are required at some processing stages to form a <u>root</u> signal from that stage (ie a signal that is invariant to further processing through the stage in question). In contrast, only a single pass of a recursive median filter is required at each stage, in order to obtain a root value from each stage.

It can be seen from FIGS. 1 and 2 that the effect of a recursive median Datasieve is to remove both maximum and minimum extrema from the incoming signal of extent (ie. the width of the peak of each extremum), equal to the scale of the current filter.

This is illustrated in the right column of FIG. 1, labelled "Granule outputs", which shows the difference between consecutive low pass outputs, ie the change in value of extrema due to the processing.

Figure 3:
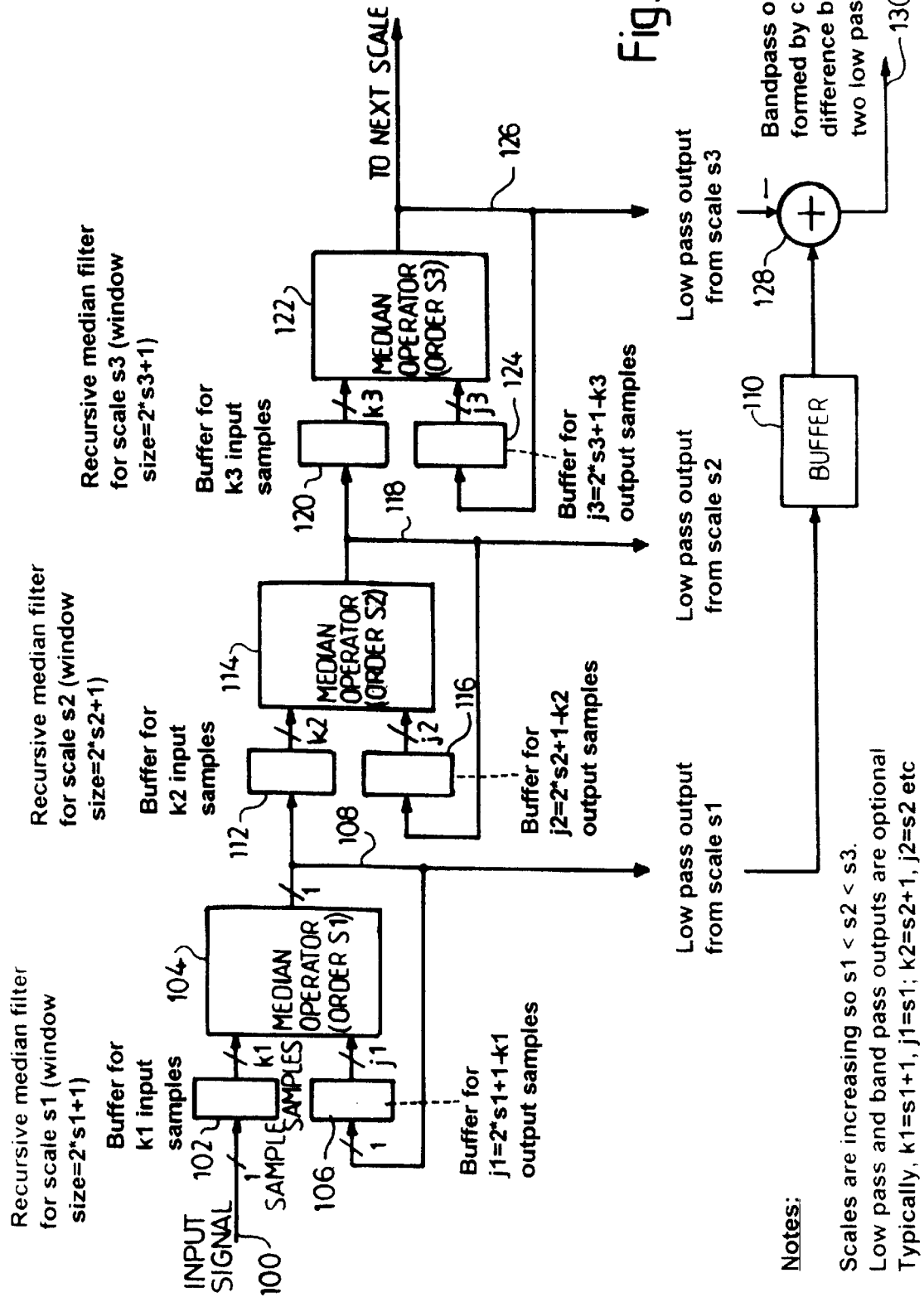
FIG. 3 is a block schematic diagram of a circuit for performing a recursive median Datasieve to produce low pass or band pass output signals.
Figure 4:
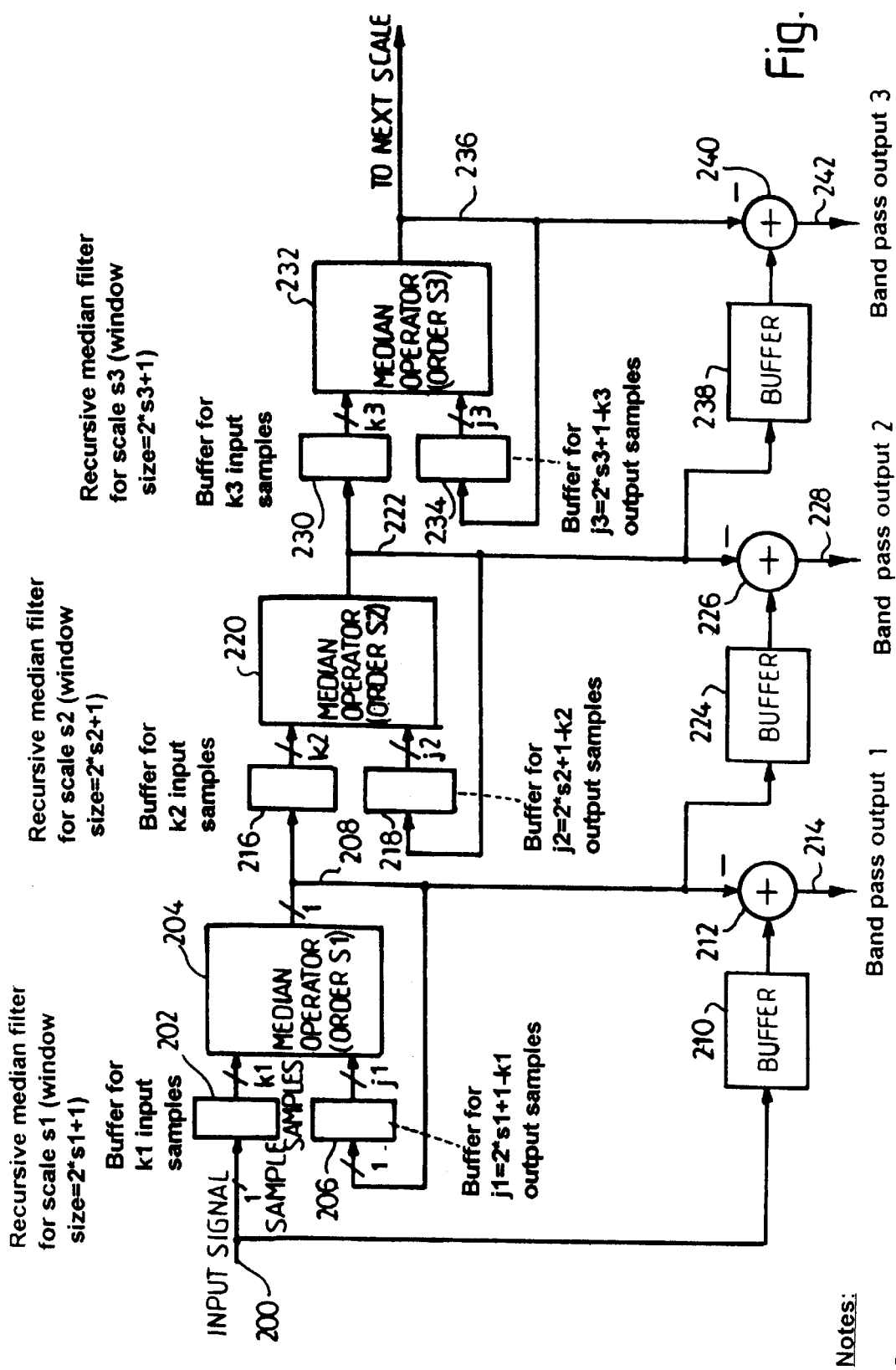
FIG. 4 is a block schematic diagram of a circuit for performing a recursive median Datasieve to produce a decomposition of the input signal into a number of band pass output signals.

FIGS. 3 and 4 show two circuits each of which can operate as a recursive median Datasieve.

FIG. 3 shows a typical circuit for performing low pass and band pass filtering. The input signal 100 is buffered in 102. The circuit 104 computes the median value of the input samples from buffers 102 and 106, giving low pass output 108. Signal 108 is fed back to buffer 106, thus implementing a recursive filter. For the median filter 104 at scale S1, the window size is 2*s1+1 of which k1 samples come from the input buffer 102 and 2*s1+1−k1 samples come from the feedback buffer 106 (typically k1+s1+1). The output signal 108 may be buffered in 110 for future use. 108 is also fed to a similar circuit comprising 112, 114, 116, 118 that performs a recursive median filter at scale s2. Similarly, 120, 122, 124 perform recursive median filtering at scale s3. The output signal 126 may be subtracted using 128 from the output of buffer 110 to give a band pass output. The filtering scales are increasing so s1<s2<s3.

FIG. 4 shows a typical circuit for performing a decomposition of a signal into band pass outputs. The input signal 200 is buffered in 202, and also passed to a buffer 210. The circuit 204 computes the median value of the input samples from buffers 202 and 206, giving low pass output 208. Signal 208 is fed back to buffer 206, thus implementing a recursive filter. For the median filter 204 at scale s1, the window size is 2*s1+1 of which k1 samples come from the input buffer 202 and 2*s1+1−k1 samples come from the feedback buffer 208 (typically k1=s1+1). The output signal 208 is then subtracted from the buffered input signal from 210 using 212 to give a band pass output signal 214. 208 is also fed to a similar circuit comprising 216, 218, 220, 222 that performs a recursive median filter at scale s2. Low pass output 222 is subtracted using 226 from the low pass output from the previous filtering scale, buffered in 224, to give another band pass output signal 228. A third filtering stage is also shown and operates in a similar manner The filtering scales are increasing so s1<s2<s3.

The recursive median filters used in FIGS. 3 and 4 may be replaced with any other recursive ordinal value filter, in which case the output signals will be different.

A useful generalization of the method is to select whether only maxima, only minima, or both maxima and minima are processed by a particular filtering stage. Processing only maxima can be achieved by applying a non-recursive minimum ordinal value filter (ie one that takes as its output the minimum value from each series of its input samples) to the input signal to the filtering stage, followed by applying a non-recursive maximum ordinal value filter (ie one that takes as its output the maximum value for each series of its input samples) to the output signal from the minimum filter.

Figure 5:
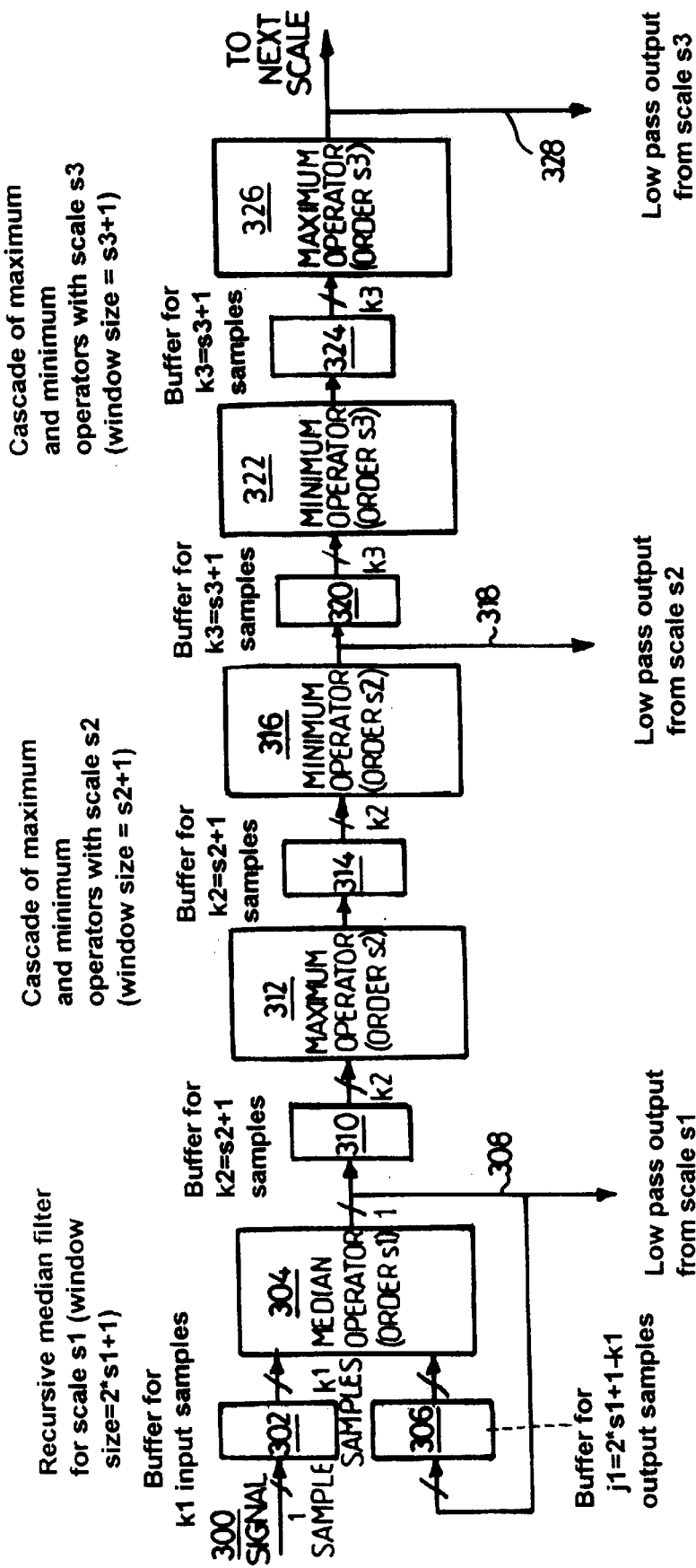
FIG. 5 is a block schematic diagram of a circuit for performing a Datasieve using recursive median filtering, max/min ordinal value filtering and min/max ordinal value filtering at different filtering stages.

Similarly, processing only minima can be achieved by applying a non-recursive maximum ordinal value filter followed by a non-recursive minimum ordinal value filter. This configuration is illustrated in FIG. 5. These combinations of maximum and minimum operators are sometimes known as opening and closing operators.

The invention includes a Datasieve in which at some filtering stages recursive ordinal value filters are employed, while at other filtering stages non-recursive ordinal value filters are employed. It also includes Datasieves in which two or more recursive or non-recursive ordinal value filters are used at each processing stage, such that the final output from the filtering stage is formed from some combination or composition of the outputs from each of the individual filters.

For example, the filters might be arranged in a cascade such that the output of the n'th filter in the stage forms the input to the (n+1)th filter in the stage.

Alternatively, a plurality of filters may be arranged in parallel so as to all operate on the input signal, and the output is formed by combining the outputs from the plurality of filters, for example using a median operator.

Such variations are illustrated in FIG. 5 in which the first stage uses a recursive median filter, while the second and third processing stages each use a cascade of two ordinal value filters (in this case, maximum and minimum operators), having the same window size and scale.

Specifically, FIG. 5 shows an input signal 300 fed into a recursive median filter of scale s1 comprising buffers 302, 306 and median operator 304 (as in FIGS. 3 and 4). A low pass output 308 is available, if required. The low pass output signal 308 is passed to a buffer 310 and then to a circuit 312 performing a max operation for scale s2 (windows size is s2+1 samples). The result is buffered in 314 and passed to a circuit 316 performing a min operation also as scale s2 (window size is s2+1 samples). The low pass output signal is 318. 318 is then passed to a similar circuit operating at scale s3 in which the min and max operators, 322 and 326 respectively, are reversed in order in this example. 320 and 324 are buffers. 328 is the low pass output signal from scale s3, which is passed to any further filtering stages. Although this example shows a recursive median filter used for the first filtering stage and max[]min combinations for the next two filtering stages, any combination of recursive ordinal value filters and max and min operators may be used within the Datasieve.

Figure 6:
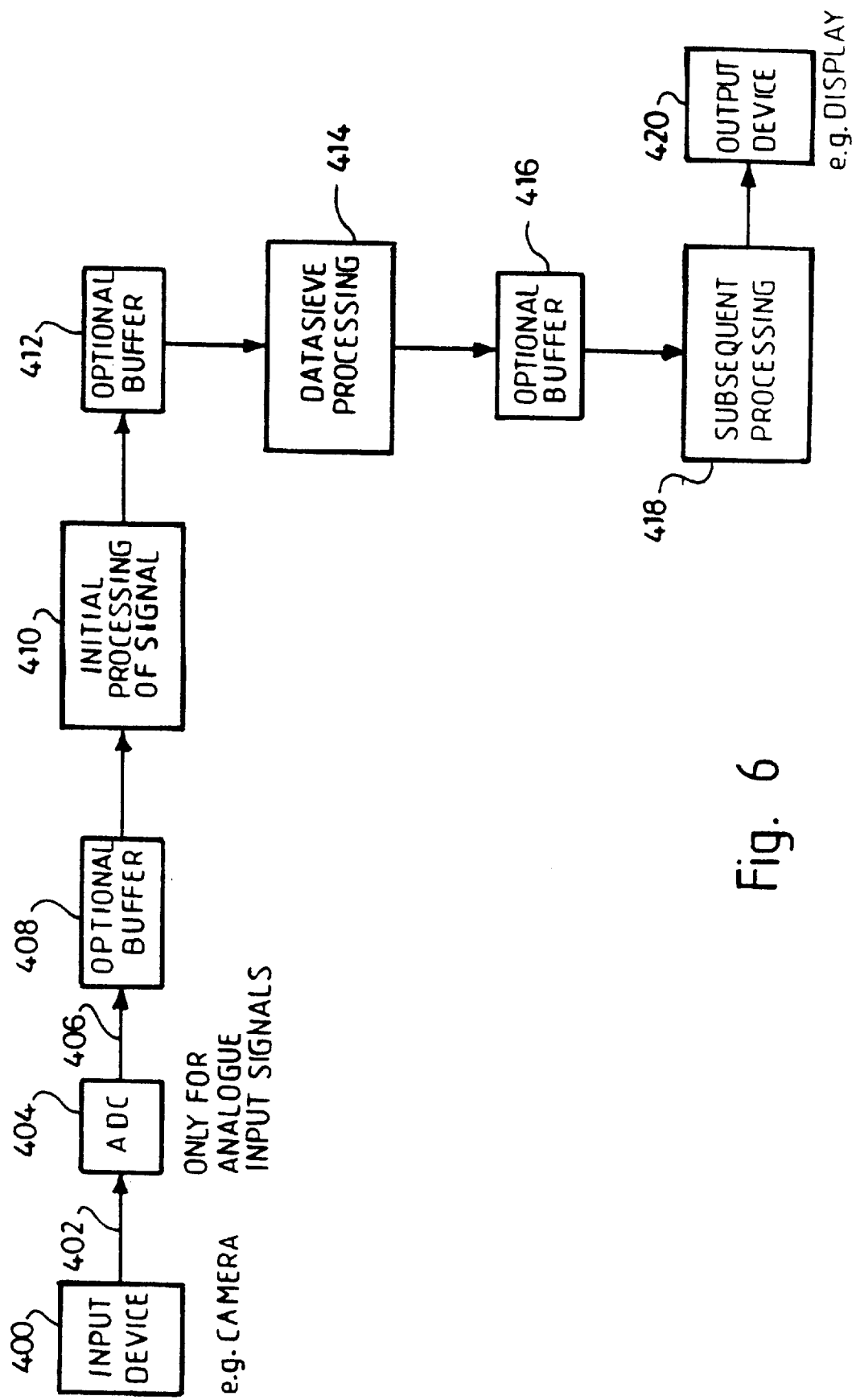
FIG. 6 illustrates a general configuration of signal processing system incorporating a Datasieve.

FIG. 6 shows a more general configuration of a signal processing system based on a Datasieve in which at least one of the filtering stages uses a recursive ordinal value filter and in which optional processing and buffering is present between and input device and Datasieve, and between Datasieve and an output device.

An input device 400, such as a camera, produces an output signal 402. If the signal 402 is analogue, then it is digitised using an analogue to digital convertor 404 to give a digital signal 406. If the signal 402 is digital, then 303 is not required. Signal 406 may optionally be buffered in 408 and then may be preprocessed using any conventional techniques, if required, by 410. The output signal from 410 may optionally be buffered in 412 before being passed to a Datasieve processor 414. At least one of the filtering stages in 414 uses a recursive ordinal value filter. The output signal from 414 (which may be a low pass, band pass or any other type of output signal) is optionally buffered in 416. The output from 416 may be post-processed using any conventional techniques in 418, if required. The processed signal may then be sent to an output device, for example a display such as a TV monitor, optionally after converting to an analogue signal using a digital to analogue convertor (not shown).

Datasieve circuits operate on digital data, and a typical input signal to such a circuit is a conglomerate of data samples. The amplitude of each sample may either be quantized to a finite number of possible amplitude levels or can be represented as a floating point number having finite precision. In applications where the data signal to be analyzed is analogue, for example an electrical signal from an analogue sensor, the signal must first be passed through an analogue to digital convertor. This is illustrated in FIG. 6.

Examples of input devices for delivering signals to this circuit or any of the circuits shown in FIGS. 3 to 9 or 11 to 12 are:

an electronic scanning device (eg. a camera);

an electronic sensing device/transducer measuring any physical phenomenon eg. a microphone or light meter;

a receiver for any type of communications channel, using any communications medium eg. optical fibre, wire or any other means of energy guidance; radio, infra-red or any other means of free space communication; sonic, ultrasonic or any other means of broadcast communication using physical modulation of a physical medium;

a storage device using any medium (eg. semiconductor, magnetic, optical).

Examples of output devices driven by signals from any of the circuits are:

devices for control or activation of any physically measurable phenomenon, eg. a switch, or a display such as a TV monitor a transmitter for any type of communications channel, using any communications medium eg. optical fibre, wire or any other means of energy guidance; radio, infra-read or any other means of free space communication; sonic, ultrasonic or any other means of broadcast communication using physical modulation of a physical medium.

a storage device using any medium (eg. semiconductor, magnetic, optical).

Some examples of applications for methods and circuits described herein are as follows:

Noise reduction, for signals or images, perhaps due to limitations in the sensor. An example would be enhancing ultrasound images.

Image processing tasks in which it is necessary to separate a wanted signal component from unwanted "clutter". An example of this type of application would be removing th background from an airline ticket image in order to leave only the text. Similar processing is applicable to other document imaging applications, such as clean-up of credit card slips.

Recognition of particular features in a signal or image. For example, detecting defects in a machined component or detecting foreign bodies in food.

Feature extraction, for pattern recognition applications, such as face recognition or signature recognition. The purpose of the Datasieve processing is to extract a set of key features that make the classification task based on these features faster and more reliable or both.

Removal of unwanted features from as a signal or image to improve the amount of data compression that can be achieved with the cleaned-up image/signal data, and so reduce storage requirements For example Datasieve could be used to extract the text from an image that contains a nonuniform background intensity.

Analysing textures in an image, for example to detect corroded regions on a metal surface.

Figure 8:
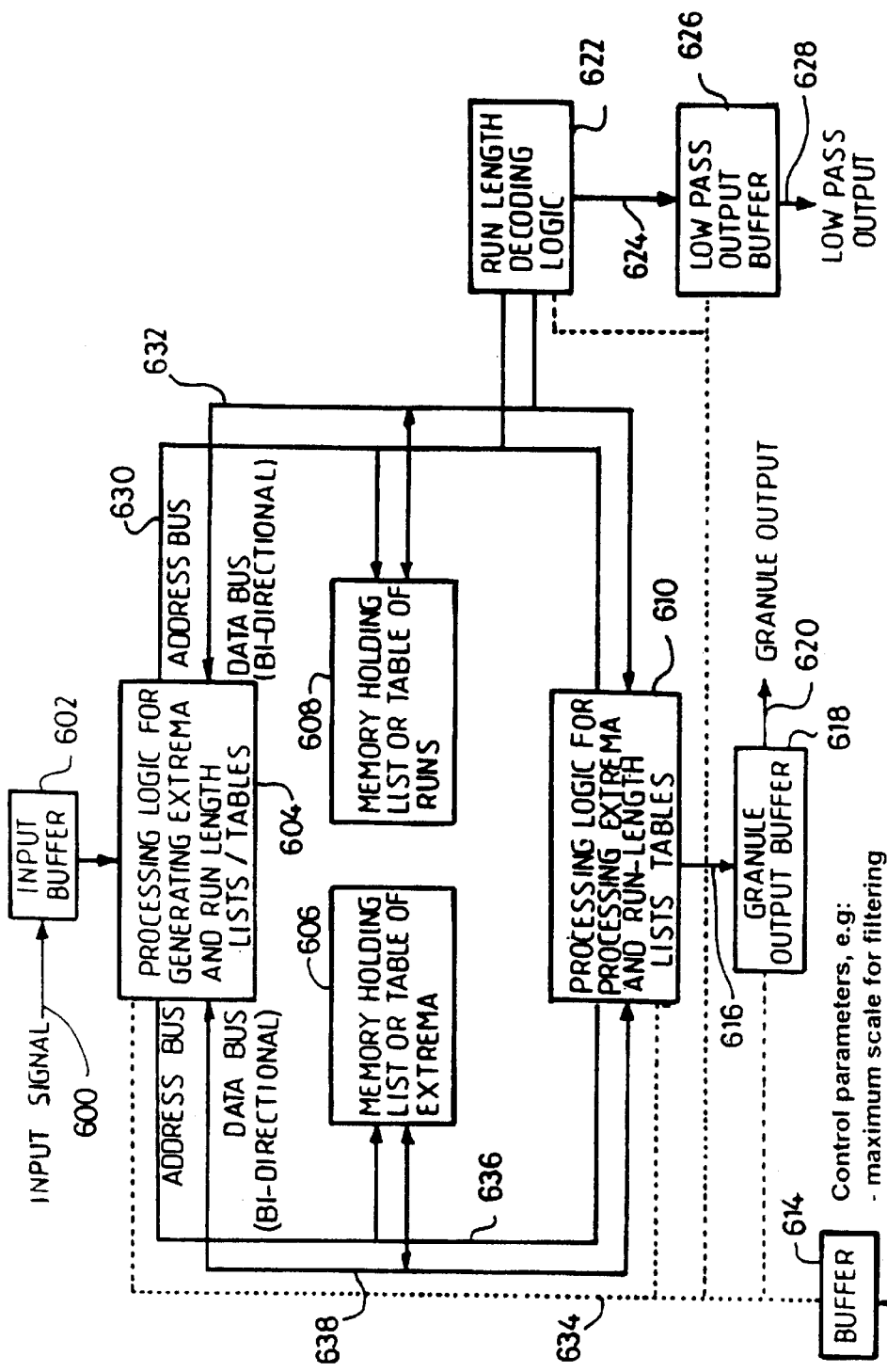
FIG. 8 is a block schematic diagram of a circuit for performing fast Datasieve processing using recursive ordinal value filtering.

The schematic of a circuit to implement the fast algorithm for the recursive median Datasieve is shown in FIG. 8. This illustrates the memory banks used to hold the list of extrema and the run-length encoded signal, and also shows the associated processing logic used to generate and manipulate the lists, and hence filter the input signal.

Figure 9:
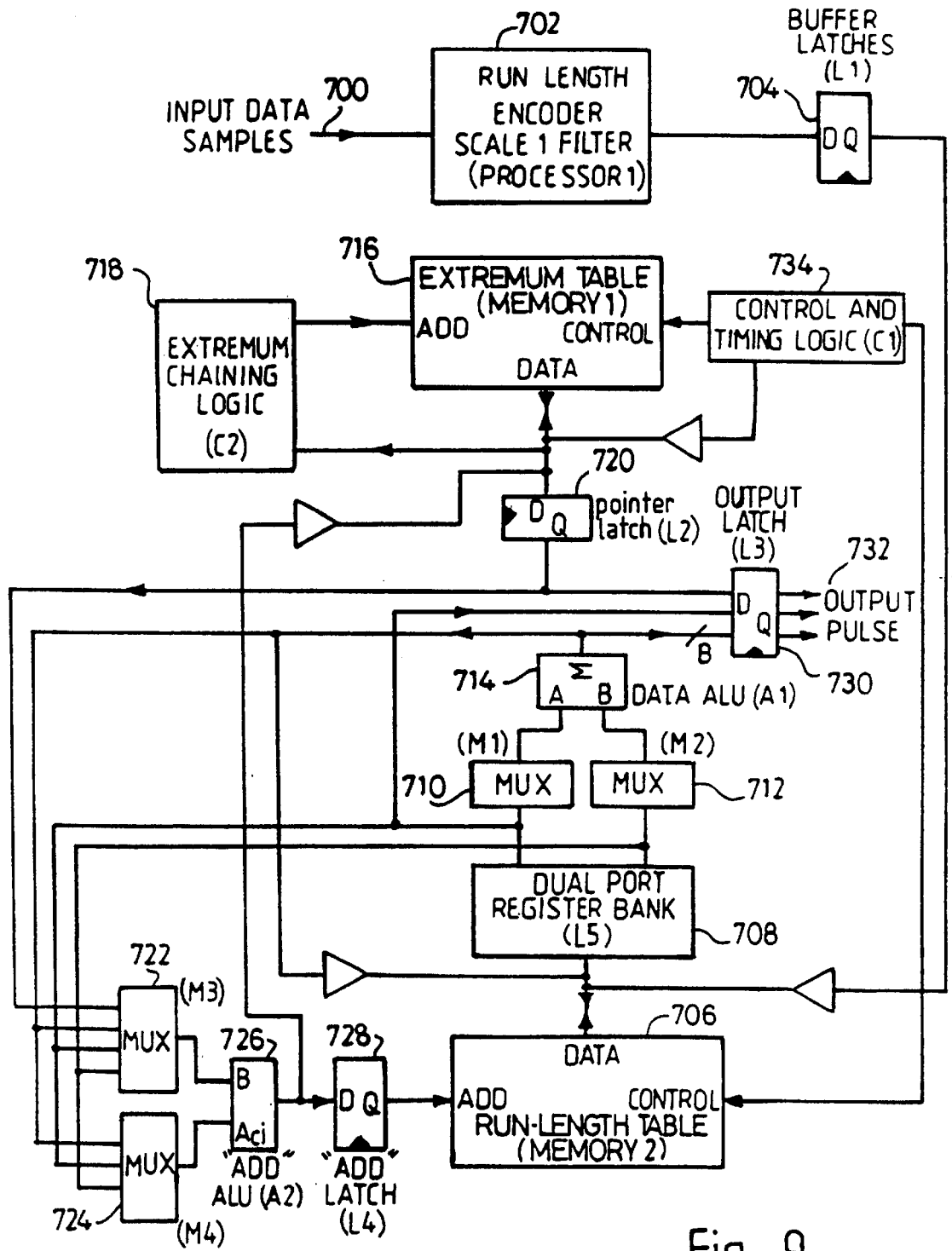
FIG. 9 is a more detailed diagram of a circuit for performing fast Datasieve processing using recursive ordinal value filtering.

A more detailed circuit is shown in FIG. 9.

With reference to both FIGS. 8 and 9, the steps involved in the method are as follows:

1. Optionally, filter the signal at the lowest scales using logic to directly implement the ordinal value filters (which is simple and fast for ordinal value filters with small window sizes).

This logic is contained in 702 in FIG. 9, operating on the input signal 700. The function is not shown in FIG. 8.

2. Encode the input signal using parameters that describe successive contiguous sequences of equal valued data samples (ie runs). For example, the runs may be described by three parameters; length, amplitude and start position (index of the first ample in the run). Store the parameters describing each run in memory.

This step is achieved in FIG. 8 using the logic 604 operating on the input signal 600 after buffering the input signal 602. The run-length memory is shown as 608 in FIG. 8; communication with the memory is via the address but 630 and the data bus 632.

The same function is shown in FIG. 9 as 702, which outputs parameters defining each run-length via buffer 704. The run-length memory is shown as 706. The address for storing each run in the run-length memory is supplied via added 726 and latch 728.

3. Identify the extrema (maxima and minima) in the data and form a list or table containing the locations of the extrema. For example, the locations of the extrema may be stored in the form of the memory address at which the corresponding run is held in the run-length memory. Store the extrema information in memory.

This step is achieved using the logic block 604 in FIG. 8. The extrema memory is 606 and is accessed using the address bus 636 and data bus 638. The logic typically involves calculating the slope of the signal at each data sample and detecting when the slope changes polarity.

In FIG. 9 the extremum memory is-shown as 716, and is controlled by the logic in 734. The required addresses are supplied by 718.

4. Iterate over the filter scales at which processing is required. For each scale, identify extrema in the extrema list that satisfy the following requirements:
   i) the extremum has extent equal (or in some implementations, less than or equal) to the current scale, where the extent of an extremum is the length of the run that forms the peak of the extremum.
   ii) optionally, the extremum has specified polarity (ie must be a maximum or must be a minimum).
   iii) optionally, the extremum is located in a specified portion of the input data, ie the position of the extremum lies within predetermined bounds.

This step is achieved using the logic block 610 in FIG. 8. The input control parameters 612 are buffered in 614 and output on the control bus 634. These parameters determine the type of filtering required and hence which extrema should be processed.

In FIG. 9, this function is performed by the control logic 734. The address of the current extremum within the extremum table 716 is generated by the extremum chaining logic 718 which provides the address f the corresponding run-length in the run-length table 706. The run parameters are read from the run-length table 706 into the dual port register bank 708, and the extent of the run is compared with the current filtering scale using adder 714. Since the adder 714 is also used for other operations, the multiplexers 710 and 812 allow different inputs to be switched into the adder inputs.

For each such extremum found, five steps (a) to (d) follow, namely;

a) calculate the new amplitude of the extremum, which is equal to the value of the adjacent run that is closest in amplitude to the current amplitude of the extremum. This step involves accessing the amplitudes of three adjacent runs from the run-length memory, and comparing their amplitudes.

In FIG. 8, this step is contained within the processing logic 610, with accessed to the run-length and extrema memories 606, 608.

This step is achieved in FIG. 9 by reading the amplitude and extent of the two runs adjacent to the extremum from the run-length memory 706 (on separate clock cycles) using the adder 728 to compute the required addresses. The inputs to the adder 728 are from multiplexers 722, 724 to allow the adder to be reused for other purposes. The run parameters are stored in the dual port register bank 708. The amplitudes of the three adjacent runs are compared using adder 714 (on separate clock cycles).

b) optionally, calculate the parameters for a "granule" that corresponds to the change in the signal due to filtering the extremum; typically, the granule parameters are the extent of the extremum, the change in amplitude of the extremum and the position of the extremum in the input signal. The granule parameters may be passed to an output buffer.

In FIG. 8, the granule parameters are calculated within the processing logic 610 and the output signal 616 is buffered in 618. External processing (not shown) can then read the granule output signal 620.

In FIG. 9, the granule amplitude is computed by adder 714 using the amplitudes of the runs already available in the dual port register bank 708. The granule parameter buffer i shown as 730. The granule parameters 732 can then be read by any external device.

c) modify the run-length list such that the run corresponding to the extremum and the adjacent run equal to its new value are merged into a single run. If the runs are stored in a linked list then this involves modifying the links between successive elements in the list such that one of the runs is removed from the list.

In FIG. 8, this is performed by processing logic 610 which accessed the run-length memory 608.

In FIG. 9, the modifications to the run-length memory 706 are achieved using adder 726 to generate the required addresses and adder 714 to generate the new extent of the merged run. The amplitude of the merged run is already available in the dual port register bank 708.

d) if the run with which the extremum has been merged also represented an extremum (of the opposite polarity), then delete both extrema from the extrema list. Otherwise, modify the record of the extremum location in the extrema list (if it has changed). If the extrema are stored in a linked list then deleting extrema involves modifying the links between successive elements in the list such that the desired elements are removed from the list.

In FIG. 8 this is performed by processing logic 610 with appropriate accesses to the run-length memory 608 and the extrema memory 606.

In FIG. 9 deletion of extrema is achieved using the extremum chaining logic 718 to modify the links held in the extremum memory 716. Modifying the extremum location is achieved using the chaining logic 718 to supply the appropriate address to the extremum memory 716 and using adder 714 to supply the new location value.

5. If required, form a low pass output signal by converting the run-length coded signal after filtering to a particular scale back into a conventional data signal.

This is achieved using the run-length decoding logic 622 in FIG. 6 which reads the contents of the run-length memory 608 and reconstructs an output signal 624. The output signal is optionally buffered in 626. Any external device may read the output signal from the buffer 628.

The same operation can be performed in FIG. 9 by reading the contents of the run-length table 706, using adder 726 to generate the required addresses An output buffer may be present, but is not shown.

The modifications to the run-length list and extrema list in steps 4c) and 4d) may be performed "in place" on the original lists rather than generating separate output lists at each scale. This reflects the recursive nature of the processing, since processing of a particular extremum can effect the processing of a larger extremum at the same scale. This also reduces the memory requirements of the circuit, since it is not necessary to allocate additional memory for the output extrema and run-length tables from each processing stage.

An alternative method uses separate lists to store the positions of extrema of different extent. This avoids the need to search the complete extrema list for extrema of the desired extent for processing. After processing, an extremum is added to the list of extremum for higher extents, provided the extremum has not been removed.

A further possibility is to use separate lists to store the positions of maxima and minima. This is particularly convenient if some of the filtering stages only operate on maxima, some only on minima and some on both maxima and minima.

The extrema can be processed in any order, though for the method to correspond to recursive median filter applied to the data in order in which it arrived, extrema should be processed in the same order as they appear in the data.

FIG. 10 shows a worked example of the operation of the fast method for computing the Datasieve. This is for a Datasieve based on recursive median filters. The extrema list holds the location of each extrema in the input data. This is shown as the "start index" of the first sample in each extremum, where an index of 1 corresponds to the leftmost sample in the input data. In practice, the location may be stored in the form of the memory address of the corresponding run in the run-length list. Typically, the extrema information is stored in a linked list, so each extremum entry also contains a pointed to the next entry in the list optionally, each extremum entry may also hold the extent of the extremum, as shown, although this information can alternatively be looked up in the run-length table.

The run-length list holds the amplitude and length of each run in the data. It may also be convenient to hold the sample index corresponding to the start (or end) of the run. If the run-length information is stored as a linked list then each entry must also contain a pointer to the next run in the list.

The figure shows the progression in the contents of the run and extrema tables with increasing filtering scale from 1 to 4. "Start" corresponds to the input data; S1 corresponds to the output from filter scale 1; Sn corresponds to the output from filter scale n. It can be seen that extrema of extent n are removed at scale n. It can also be observed that whenever an extrema is processed, a pair of adjacent runs are merged into a single longer run. Hence, the run-length and extrema lists become progressively shorter with increasing filtering scale.

Figure 11:
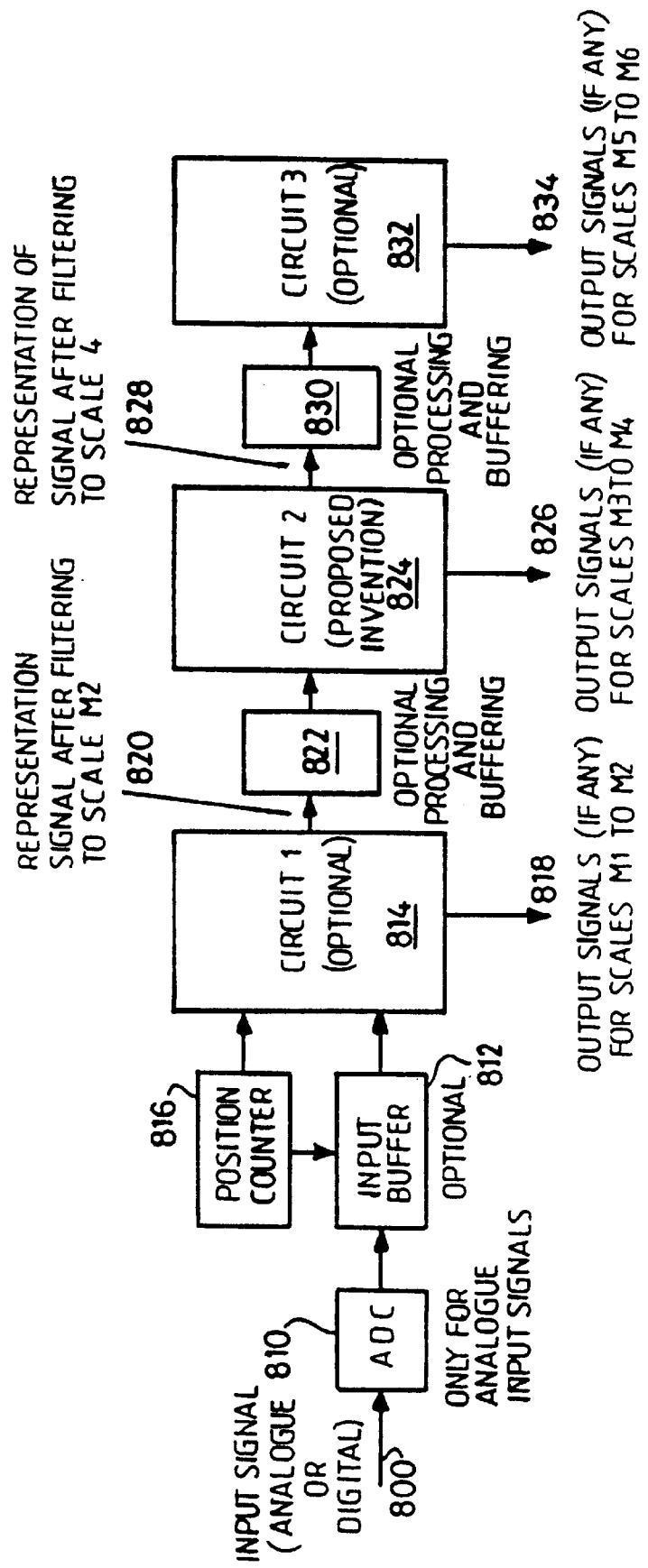
FIG. 11 illustrates the use of different methods of computing the Datasieve for different filtering stages.

FIG. 11 shows a general Datasieve processing scheme in which different methods of computing the Datasieve are used for different ranges of filtering scales. This is useful because some methods for computing the Datasieve may be particularly efficient for smaller scales, while other methods might be more appropriate at higher filtering scales. This allows a better overall compromise between speed of operation and circuit complexity to be achieved.

In FIG. 11, the input signal 800 is converted, if necessary, into a digital signal using the optional analogue to digital converter 810. The digital signal is optionally buffered using 812. The index of each sample is maintained using an optional counter 816. Circuit 814 is used to perform filtering at the lowest scales M1 to M2. This circuit is chosen such that it is particularly efficient at low filtering scales. It produces an optional output signal 818. A representation of the signal after filtering to scale M2, 820 is passed to optional processing and buffering 822. For example, signal 820 may represent the filtered signal in its run-length encoded form Circuit 824 takes the output from 822 and filters it from scale M3 to M4 using the fast method previously described in FIGS. 8, 9 and 10. An optional output signal may be produced 826. A representation of the signal after filtering to scale M4, 828, is passed to optional processing and buffering 830. The output signal from 830 is processed using a third circuit for computing the Datasieve between scales M5 and M6. This circuit is chosen such that it is particularly efficient at high filtering scales An output signal 834 may be produced.

An effective method for processing multidimensional data, for example images, using the recursive median Datasieve is to apply one dimensional Datasieves at multiple orientations. This method involves scanning the multidimensional signal at the desired orientation to form one or more one dimensional signals, then applying a one dimensional Datasieve to each one dimensional signal. For example, all the rows or all the columns of an image might be processed using one dimensional Datasieves.

In general, processing at any orientation is possible by scanning the image at an appropriate angle, although this may require either interpolating between the existing data samples to estimate the data values at intermediate points, or approximating the required scan orientation.

Filtering at multiple orientations can be done in two ways (a) and (b):

(a) Parallel filtering

In this method, the multidimensional input signal is filtered at one orientation (eg. all the columns of an image are filtered), and also at a different orientation (eg. all the rows of the output image are filtered).

In general, the input signal can be filtered at N orientations.

The outputs from the different orientations are then combined to form the final output signal.

Figure 7:
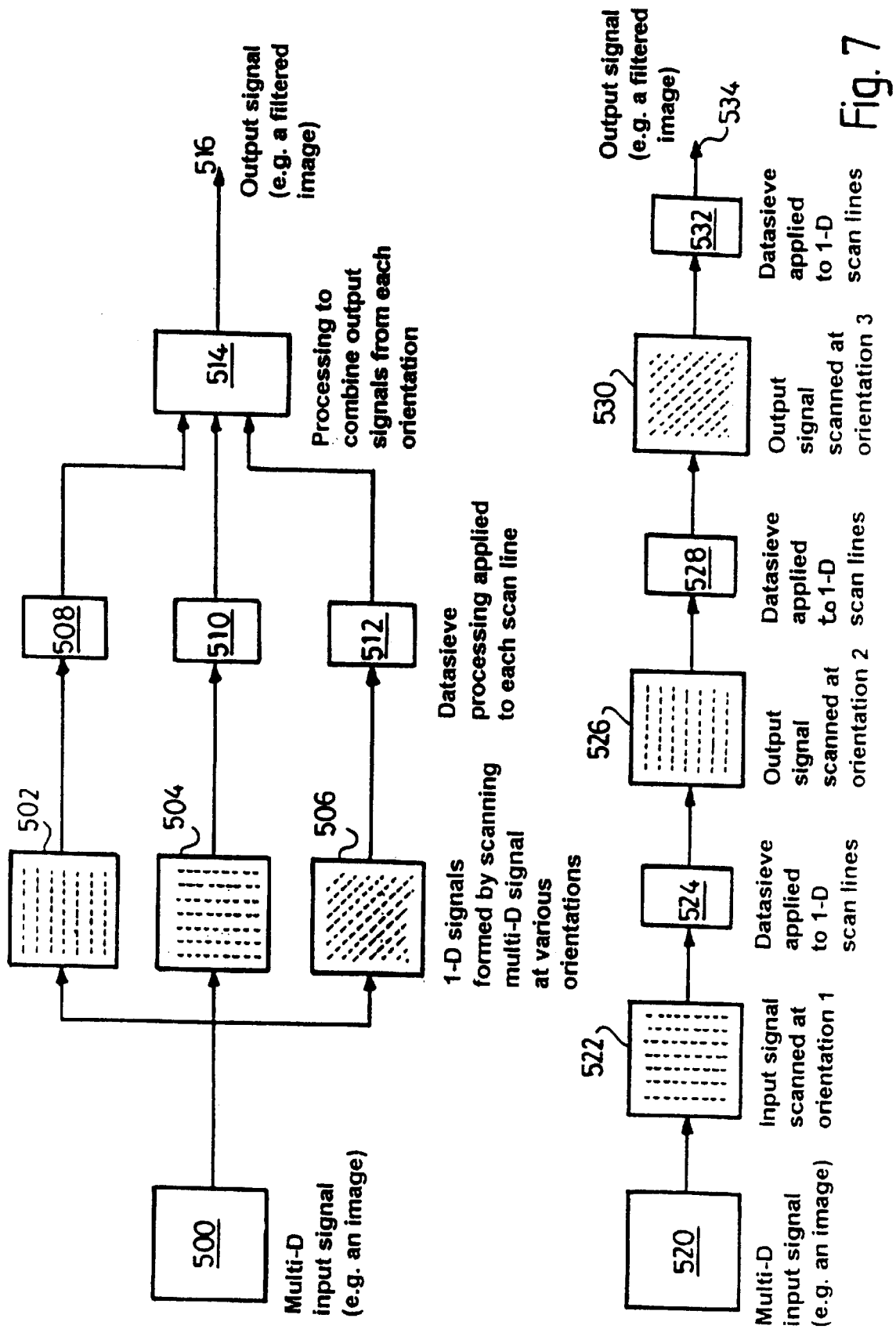
FIG. 7 illustrates various configurations of signal processing system in which one dimensional Datasieves are applied to a multidimensional input signal at different orientations.

Typical combination operators are max, min, mean, median addition, multiplication and logic operators such as AND and OR. This method is illustrated in FIG. 7 (top), wherein 500 is a multidimensional input signal, for example an image. For illustrative purposes, 500 is shown as a two-dimensional signal, but it could three or more dimensions. In this example, 500 is scanned at three different orientations as shown in 502, 504 and 506 in which the dotted lines indicate the orientation of the scanning. In each case, the scan lines are processed using a Datasieve 508, 510, 612 respectively.

At least one of the Datasieves uses a recursive ordinal value filter for at least one of the filtering states. Alternatively a single Datasieve processor could be used to process each of the signals in turn from 502, 504 and 506 in which case a multiplexer (not shown) would be required prior to the Datasieve processor.

The outputs from the three Datasieve processors are combined using processing in 514 to give an output signal 516. A typical output signal is a filtered image. If only a single Datasieve processor is used, multiplexed between the various scan orientations, then an additional buffer may be required prior to 514 to hold the various output signals from the Datasieve processor. The Datasieve processing may be different at the various orientations, and the processing used to combine the output signals from each orientation may take any form. In general, the input signal may be processed at any number of orientations.

(b) Series filtering

In this method, the multidimensional signal is filtered at one orientation (eg. all the columns of an image are filtered), then a multidimensional output signal formed from the outputs of each of the dimensional filter is filtered at a different orientation (eg. all the rows of the output image are filtered). This can be repeated for N orientations, in which output the signal from orientation n forms the input signal to orientation (n+1).

This method is illustrated in FIG. 7 (bottom), in which 520 is a multidimensional input signal, for example an image. For illustrative purposes, 520 is shown as a two-dimensional signal, but it could be three or more dimensions. In this example, 520 is initially scanned vertically as shown in 522. The resulting one-dimensional signal from each scan line is processed using a Datasieve 524. The output signals from the Datasieve are reconstructed to form a filtered multidimensional signal, and this is then scanned at different orientation 526. The resulting one-dimensional signals from each scan line are processed using a Datasieve 528.

The output signals from the Datasieve are reconstructed to form a filtered multidimensional signal, and this is then scanned at a different orientation 530 and processed using a Datasieve 532.

After the required number of orientations, an output signal is produced 534, such as a filtered image.

524, 528 and 532 may be three separate circuits, or alternatively, the same circuit may be reused (though possibly reconfigured to perform a different filtering function).

The Datasieve processing applied at each orientation may be different, and the input signal may be processed at any number of orientations. At least one of the Datasieves 524, 528, 532 uses a recursive ordinal value filter for at least one of the filtering stages.

Note that the filter parameters (eg. the filtering scale from which the output signals are derived, and the selection of whether maxima, minima or both maxima and minima are processed at each scale) may be different for each orientation.

It has already been observed that for different orientations, different processing may be applied, such as linear filtering, at some orientations and Datasieve filtering at other orientations. The combination of Datasieve and conventional processing may be achieved in both series and parallel structures, as illustrated in FIG. 12.

Figure 12:
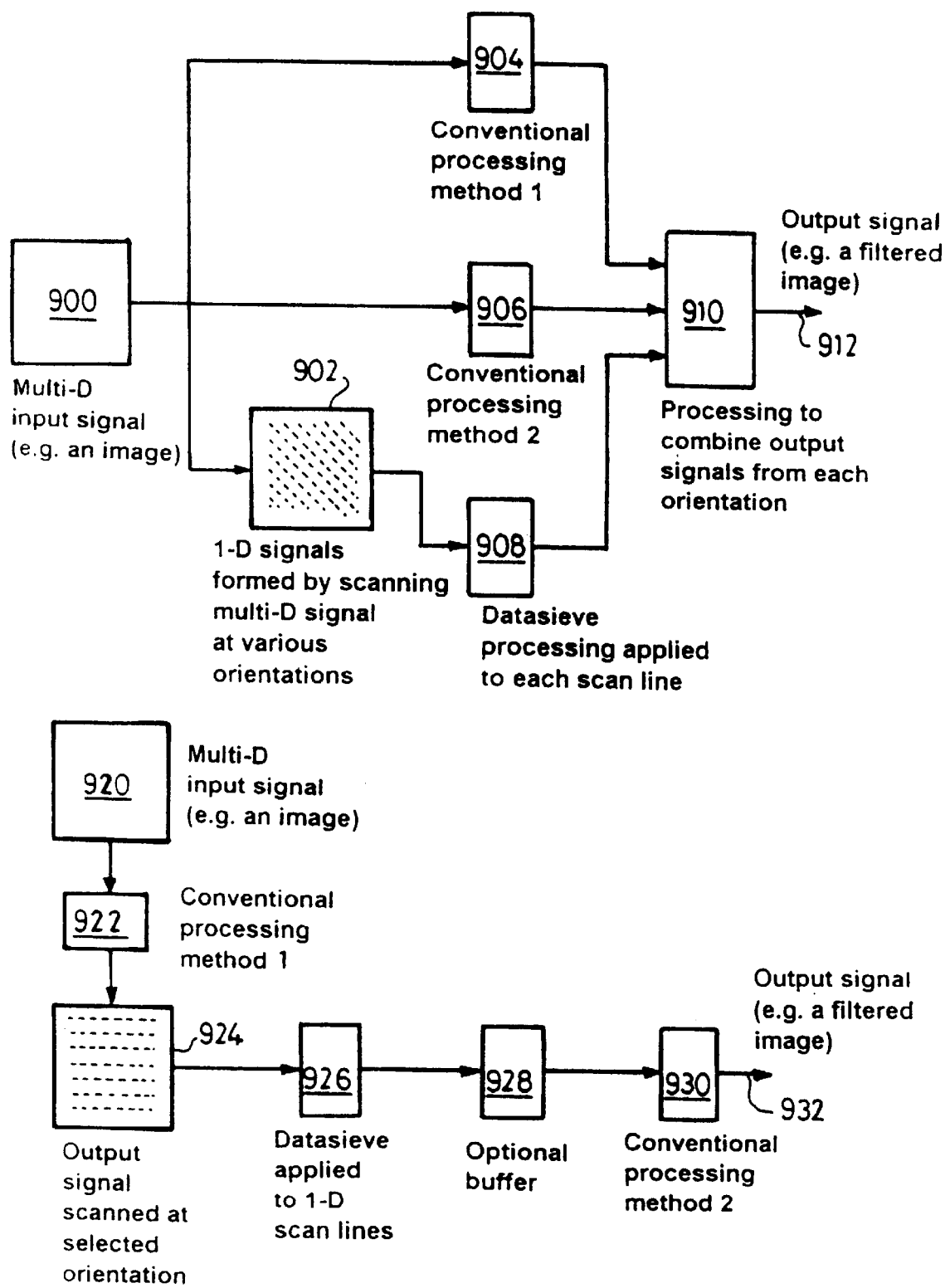
FIG. 12 illustrates a general configuration of signal processing system incorporating both Datasieve filtering and conventional filtering.

FIG. 12 (top) shows a multidimensional input signal 900, for example an image. This is processed in three different ways. 904 and 906 are conventional processing techniques. 908 is a Datasieve applied at a particular orientation using 902 which scans the input signal 900 at the chosen orientation. The output signals from the three types of processing are combined using 910, which may contain any processing or buffering, and an output signal 912, such as a filtered image, is produced. The Datasieve uses a recursive ordinal value filter for at least one of the filtering stages. Any number of Datasieves and conventional processing techniques may be applied to the input image, with appropriate modification to 910 to accommodate more input signals. In this case, the multiple Datasieve processors may operate at different orientations, and may use different filtering.

FIG. 12 (bottom) shows a multidimensional input signal 920, for example an image. This is first produced using a conventional processing technique 922. The result is scanned at a particular orientation using 924 and the one-dimensional scan lines are processed using a Datasieve 926. The Datasieve uses a recursive ordinal value filter for at least one of the filtering stages. The output signal from the Datasieve may be optionally buffered using 928 and then processed using any conventional technique using 930. This produces an output signal 932, such as a filtered image. There may be any number of Datasieve and conventional processing techniques in the cascade, and they may be arranged in any order. This may include multiple Datasieve processors operating at different orientations, and possibly using differing filtering.

What is claimed is:

1. A method of filtering and analysing a data signal consisting of a series of data samples to separate wanted data samples from unwanted data samples, comprising the steps of:
   (i) passing the data signal through a plurality of ordinal value filters so as to produce a plurality of band pass output signals, wherein each ordinal value filter has a predetermined window size, and the plurality of ordinal value filters are arranged in a cascade such that an input signal to each successive ordinal value filter is formed from an output signal of the preceding ordinal value filter and each ordinal value filter has a larger window size than the ordinal value filter preceding it in the cascade;
   (ii) processing the input signal for at least one ordinal value filter before input to the ordinal value filter so as to identify extrema within the input signal and the extent of the identified extrema;
   (iii) selecting parts of the input signal so as to select those extrema having a desired range of extents and inputting the selected parts of the input signal into at least one ordinal value filter;
   (iv) recursively filtering the series of data samples by using at least one of the ordinal value filters as a recursive ordinal value filter; and
   (v) combining a predetermined selection of the band pass output signals to form a filtered output signal.

2. A method according to claim 1, wherein each recursive ordinal value filter is a recursive median filter.

3. A method according to claim 2, wherein the window of each recursive median filter is of size (2*n)+1 data samples.

4. A method according to claim 1, further comprising combining more than one ordinal value filter to form a filtering stage, and forming a final output from the filtering stage from the output signal of one, or a combination of the output signals from two or more, of the ordinal value filters used in said filtering stage.

5. A method according to claim 4, further including the step of low pass filtering to remove signal components corresponding to extrema of limited extent by forming an output signal corresponding to the output of a selected filtering stage.

6. A method according to claim 4, further including the step of band pass filtering to extract signal components corresponding to extrema with a particular range of extents by subtracting the output of one filtering stage from the output of another filtering stage.

7. A method according to claim 4, further comprising filtering at each filtering stage only extrema of extent equal to a window size of the filtering stage.

8. A method according to claim 4, further comprising filtering at each filtering stage only extrema of extent less than a window size of the filtering stage.

9. A method according to claim 4, further comprising filtering extrema being maxima and minima within each filtering stage by using a recursive median filter.

10. A method according to claim 4, further comprising filtering extrema being only maxima within each filtering stage by using a minimum ordinal value filter followed by a maximum ordinal value filter.

11. A method according to claim 4, further comprising filtering extrema being only minima by using a maximum ordinal value filter followed by a minimum ordinal value filter.

12. A method according to claim 4, wherein the signal conglomerate is multi-dimensional, and the method further comprises scanning and filtering the multi-dimensional signal conglomerate, and generating a combined output signal by combining output signals derived from at least two or more of said filtering stages, where the filtering stages are filtering at different orientations.

13. A method according to claim 1, wherein at least one of the ordinal value filters consists of a minimum ordinal value filter, which takes a minimum input value as its output.

14. A method according to claim 1, wherein the band pass output signals are multi-dimensional and the windows used by the ordinal value filters in the cascade are multi-dimensional.

15. A method according to claim 1, further comprising selecting a subset of data samples contained within the band pass output signals according to a selection criterion, and outputting information describing the selected subset of data samples.

16. A method according to claim 1, further comprising combining the data samples of said subset of data samples to produce an output signal whose amplitude is the sum of the amplitudes of said data samples in the subset.

17. A method according to claim 1, further comprising searching an input signal to at least one of the filtering stages for extrema, and storing in a memory information which describes the location of each detected extremum within the input signal.

18. A method according to claim 17, further comprising storing in a memory information about extrema extents.

19. A method according to claim 17, further comprising storing information about maxima in a list which is separate from a list containing information about minima.

20. A method according to claim 17, further comprising storing information about extrema of different extents in separate lists.

21. A method according to claim 17, further comprising modifying information stored in the memory directly on processing each extremum of the extrema.

22. A method according to claim 17, where a filtered value of a first extremum is equal to a filtered value of an adjacent data sample that forms at least part of a second extremum of opposite polarity, the method further comprising excluding at least one of the first and second extrema from the list of extrema before passing the list of extrema to the next filtering stage.

23. A method according to claim 17, further comprising ordering the list of extrema stored in the memory according to the location of the extrema in the input signal.

24. A method according to claim 17, further comprising ordering the list of extrema stored in the memory according to the extents of the extrema.

25. A method according to claim 17, further comprising storing the input signal to at least one of the filtering stages as encoded information in which at least part of the stored encoded information describes contiguous sequences, or runs, of equal value data samples.

26. A method according to claim 25, wherein the stored encoded information for each contiguous sequence of equal value data samples includes the number of data samples in the contiguous sequence and the amplitude of said equal value data samples.

27. A method according to claim 25, wherein the stored encoded information for each contiguous sequel of equal value data samples includes data identifying the locations of at least two of said equal value data samples in the contiguous sequence, and the amplitude of the equal value data samples.

28. A method according to claim 17, further comprising modifying the memory containing information relating to the input signal to the filtering stage.

29. A method according to claim 17, wherein for searching the input signal for extrema, reference is made to the amplitudes of three runs of data samples within the input signal: a run of data samples corresponding to the extremum, a run of data samples immediately before the extremum and a run of data samples immediately after the extremum.

30. A method according to claim 1, further comprising determining a new amplitude of data samples corresponding to an extremum that requires filtering by referring to the amplitude of said extremum, the amplitude of a data sample immediately before said extremum and the amplitude of a data sample immediately after said extremum.

31. A method of filtering a signal conglomerate according to claim 1, wherein the signal conglomerate is multidimensional, the method further comprising scanning the multidimensional signal conglomerate at a plurality of different orientations to produce one-dimensional signals, and filtering the one-dimensional signals to produce one-dimensional band pass output signals.

32. A method according to claim 31, further comprising combining the one-dimensional band pass output signals to construct a multi-dimensional band pass output signal.

33. A method according to claim 31, further comprising the step of using said one-dimensional signals to produce intermediate signals, scanning the intermediate signals at a different orientation to produce a further set of signals and using said further set of signals to produce a final multidimensional band pass output signal.

34. A method according to claim 31, further comprising filtering the multi-dimensional signal conglomerate using conventional filtering techniques to produce a filtered input signal for passing through said plurality of ordinal value filters.

* * * * *